United States Patent
Anderson

(10) Patent No.: US 7,580,531 B2
(45) Date of Patent: Aug. 25, 2009

(54) DYNAMIC RANGE REDUCING VOLUME CONTROL

(75) Inventor: Charles Anderson, Boulder, CO (US)

(73) Assignee: Cirrus Logic, Inc, Austin, TX (US)

( * ) Notice: Subject to any disclaimer, the term of this patent is extended or adjusted under 35 U.S.C. 154(b) by 1211 days.

(21) Appl. No.: 10/773,620

(22) Filed: Feb. 6, 2004

(65) Prior Publication Data

US 2005/0175194 A1    Aug. 11, 2005

(51) Int. Cl.
H03G 7/00    (2006.01)
H04B 1/00    (2006.01)
H03G 3/20    (2006.01)

(52) U.S. Cl. .............................. 381/106; 381/86; 381/57

(58) Field of Classification Search .................... 381/86, 381/57, 106–109
See application file for complete search history.

(56) References Cited

U.S. PATENT DOCUMENTS 4,216,427 A    8/1980    Bethards
5,471,651 A    11/1995    Wilson
5,892,834 A    4/1999    Smart et al.
5,907,622 A *    5/1999    Dougherty .................... 381/57
6,278,751 B1 *    8/2001    Uramoto ...................... 381/86
6,473,662 B2    10/2002    Lubbe et al.
7,333,618 B2 *    2/2008    Shuttleworth et al. ......... 381/57

* cited by examiner

Primary Examiner—Ping Lee
(74) Attorney, Agent, or Firm—Law Office of Dan Shifrin, PC

(57) ABSTRACT

An audio amplifier is provided having a compressor with an automatically-adjustable compressor. Compression is linked to the volume control in an inverse relationship whereby, when the volume is reduced, the compression ratio is increased to boost the listening level of quieter passages in the source material. Conversely, when the volume is increased, the compression ratio is decreased. The compression control may be physically connected to the volume control, such as in a dual-potentiometer, or may be coupled electronically, such as with a digital signal processor. An effects level control may be included to allow a listener to increase or decrease the effect of the compression by applying a multiplier to the compression ratio. An ambient noise detector may also be included such that compression is increased as ambient noise increases or exceeds a predetermined level.

43 Claims, 7 Drawing Sheets

DYNAMIC RANGE REDUCING VOLUME CONTROL

TECHNICAL FIELD

The present invention relates generally to audio compression and, in particular, to dynamically adjusting compression in an inverse manner relative to volume.

BACKGROUND ART

In many applications of audio equipment, such as televisions, stereo amplifiers CD players and the like, music and other recorded (or live) material generally includes both loud passages and quiet passages. If the audio volume is high enough (such as in a noisy environment), both quiet and loud passages a sufficiently audible. However, if the volume is reduced, quiet passages may become inaudible and one's listening enjoyment is reduced.

A compressor may be inserted into the audio path. If the compressor has a fixed compression ratio, it may be turned on and off as desired by the listener. However, the fixed compression ratio may be adequate for only a limited number of listening situations. Moreover, turning the compressor on and off is an inconvenience to the listener. If the compressor has a variable ratio, not only may it be turned on and off as desired by the listener but the compression may be adjusted, as well. As is known, compression tends to reduce audio quality and should be used sparingly, if at all. Thus, an experienced listener should adjust the compression whenever the volume level is changed. And, an inexperienced listener (or one who doesn't like the inconvenience of dual adjustments) may simply leave the compressor off or leave it on with the compression set to some arbitrary ratio rarely, if ever, changing it.

SUMMARY OF THE INVENTION

The present invention provides an audio amplifier having an automatically-adjusting compressor. Compression is linked to the volume control in an inverse relationship whereby, when the volume is reduced, the compression ratio is increased to boost the listening level of quieter passages in the source material. Conversely, when the volume is increased, the compression ratio is decreased. The compression control may be physically connected to the volume control, such as in a dual-potentiometer, or may be coupled electronically, such as with a digital signal processor. An effects level control may be included to allow a listener to increase or decrease the effect of the compression by applying a multiplier to the compression ratio. An ambient noise detector may also be included such that compression is increased as ambient noise increases or exceeds a predetermined level. The source program's dynamic range may also be used to determine the compression ratio.

When all of such controls are included, the compression ratio may be computed as:

$1+(PDR/(V-NT)-1)*EL$, if $(NT+PDR)>V$; and $1$, if $(NT+PDR)<=V$, where: V is the volume setting in dB; NT is the noise threshold in dB; EL is the effects level in percent; and PDR is the program dynamic range in dB.

DETAILED DESCRIPTION OF THE PREFERRED EMBODIMENT

Figure 1:
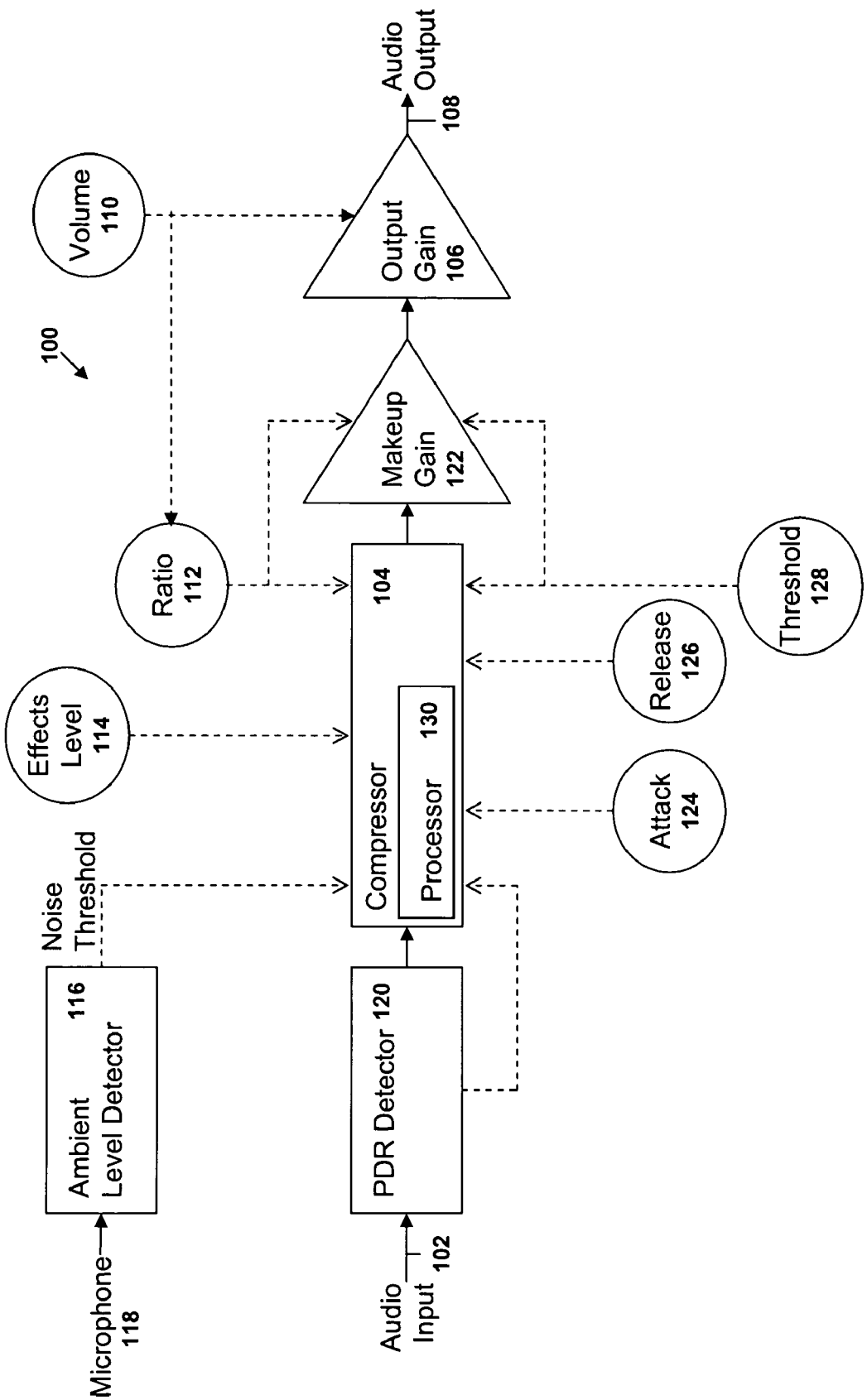
FIG. 1 is a block diagram of an audio amplifier of the present invention with dynamically adjustable compression.

FIG. 1 is a block diagram of an audio amplifier 100 of the present invention with dynamically adjustable compression. The amplifier 100 includes an audio input 102, a compressor 104, an audio gain stage 106 and an audio output 108. The amplifier 100 further includes a volume control 110 and a compression ratio control 112. The compression control 112 establishes a compression ratio which is applied to audio program material processed by the compressor 104. Compressed audio is output to the audio gain stage 106. The volume control 110 provides an audio level signal in response to adjust the volume V of the audio output from the audio gain stage 106.

The volume control 110 is also coupled to the compression control 112. In one embodiment, the volume control 110 and a compression control 112 are each part of a dual-potentiometer. In another embodiment, the compression control 112 is included in a digital signal processor (DSP) having an input coupled to the volume control 110. Other configurations are also possible. In operation, when the volume control is adjusted to reduce the volume of audio output from the gain stage 106, the compression ratio established by the compression control 112 automatically increases in inverse proportion to the volume setting. Thus, a greater amount of compression is applied at low listening volumes and, conversely, a lesser amount of compression is applied at higher listening volumes. The amount of compression to be applied at any particular volume setting may be determined by the amplifier designer, balancing the desirability to hear quiet passages in the program material against the desirability to maintain audio quality. A dual-potentiometer, if employed, may be linear or non-linear across the range of control. A DSP, if employed, may be programmed with a formula or with a lookup table; either method may provide for a linear or non-linear relationship between volume and compression.

Preferably, the amplifier 100 further includes a makeup gain stage 122 which may be used to offset at least part of the reduced volume caused by compression. The makeup gain stage 122 thus increases the volume of the output to enable softer passages (which are above a threshold) to be audible and is computed as:

MakeUp Gain=−(Thresh−(Thresh/Ratio)) [Eq. 1]

The makeup gain stage 122 may be a separate stage, as illustrated in FIG. 1, or its function may be incorporated in the output gain stage 106. If the latter configuration is employed, particularly if the amplifier is DSP-based, the gain of the output gain stage 106 may be computed as a combination of the volume control input and the desired makeup gain. The makeup gain stage 122 and compressor 104 may be combined in a "downward compressor" with a threshold control.

An additional control which may be included in the amplifier 100 is an effects level control 114. Adjusted by a listener, the effects level control 114 provides a signal EL to the compressor 104 to vary the amount by which changes in the volume control 110 will affect the compression ratio. For example, if a setting of 100 for the effects level control 114 results in a "normal" amount (100%) of compression being applied, a setting of 0 may result in no compression being applied (0%) (effectively turning the compressor 102 off) and a setting a 200 may result in twice the compression being applied (200%). Thus, a listener is able to customize the amplifier for his or her listening preferences, the type of program material being listened to, or even the setting in which the program material is being heard. The effects level, if used, may be set to a fixed level or may be adjustable by the user with, for example, a knob or a set of switches.

In a noisy environment, quieter passages in the program material may be inaudible. Consequently, the amplifier may also include a level detector 116, with a microphone 118 with which to input ambient sound, to automatically generate a noise threshold NT. (The noise threshold may also be set to a fixed value or adjusted by the listener.) The noise threshold is the level below which a sound is obscured by the ambient noise and is used by the compressor to further automatically adjust the compression ratio. Thus, when the ambient noise is higher, the compression will increase to render previously inaudible passages audible. In a further aspect in which the amplifier 100 is installed as part of a vehicle audio system, the level detector may be coupled to receive a signal from vehicle status detectors. Such detectors preferably includes a speed detector indicative of the ambient noise level in the vehicle. Other sensors may detect open windows and sun roofs and whether a convertible top is down, all factors which affect the ambient noise level. The relationship between the speed and the noise level may be adjusted for different vehicles (a luxury car will have a lower ambient noise level than an off-road pick-up truck) and may be in the form of an algorithm, a lookup table or the like. Similar relationships may also be established in algorithms, tables or the like and may be linked to the speed/noise relationship. Thus, the compression ratio may be automatically adjusted to reflect changes in the noise within the vehicle based upon the speed of the vehicle.

Another feature which may be included in the amplifier 100 of the present invention is a program dynamic range detector 120. The program dynamic range is the range of audio levels in the source program material. If, for example, music has a dynamic range of 36 dB (that is, from a maximum level of 0 dB to a minimum of −36 dB) and the volume control 110 is set to full volume (0 dB), all of the music will be heard if the noise threshold is −36 dB. However, if the volume control 110 is set instead to −12 dB, any music having a level below −24 dB will be inaudible unless compression is applied. The program dynamic range (PDR) may be fixed at a level established by the designer of the amplifier. Alternatively, the PDR may be set by the listener by, for example, changing the position of a multi-position switch or pushing buttons corresponding to different types of music (classical (wide dynamic range), pop (narrow range), rock, jazz, etc.). The PDR may also be set adjusted automatically by using the detector 120 to sample the program material and measure the difference between the maximum and minimum levels over a predetermined period of time. Or, the detector may be responsive to the source of the program material selected by the listener (tuner (narrower dynamic range), CD (greater range), etc.).

It will be appreciated that the compressor 104 may also include such additional controls as attack 124, release 126 and threshold 128. If used, a threshold setting of −PDR may produce satisfactory results.

A processor 130 in the compressor may be used to compute the compression ratio as:

$$\text{Ratio}=1+(PDR/(V-NT)-1)*EL, \text{ if } (NT+PDR)>V; \text{ and} \quad [\text{Eq. 2}]$$

$$\text{Ratio}=1, \text{ if } (NT+PDR)<=V. \quad [\text{Eq. 3}]$$

Figure 2:
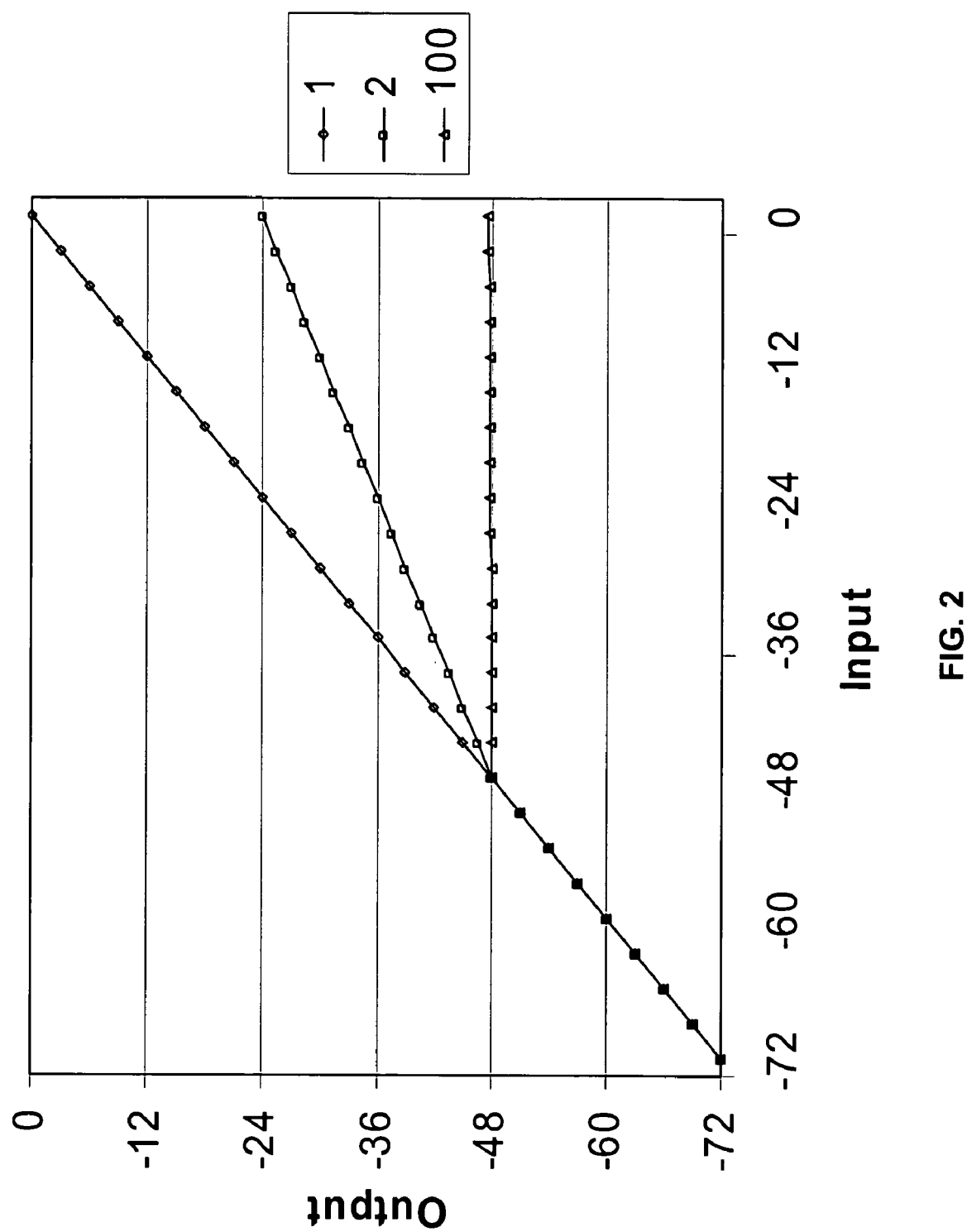
FIG. 2 is a plot of the output of the compressor operated at three compression ratios.
Figure 3:
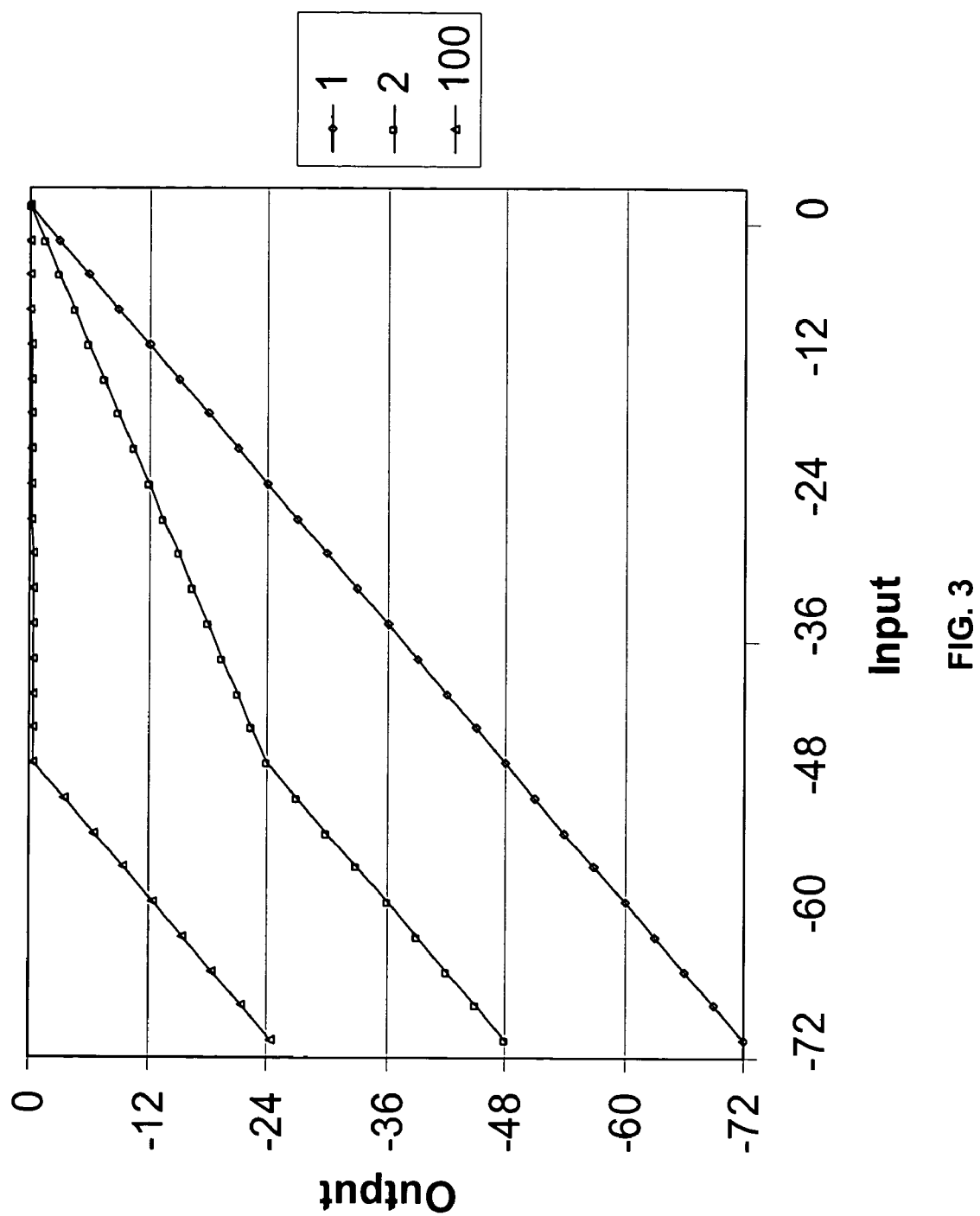
FIG. 3 is a plot of the output of the compressor operated at three compression ratios with makeup gain applied.

FIG. 2 is a plot of the output of the compressor 100 relative to the input at three compression ratios, 1, 2 and 100, with the threshold 128 set to −48 dB and no makeup gain 122 applied. FIG. 3 is a plot of the output of the compressor 100 at the same three compression ratios and threshold level but with makeup gain 122 of −(Thresh−(Thresh/Ratio)); that is, approximately 0, 24 and 47.52 dB, respectively.

FIGS. 4-7 are plots of the output of the compressor 100 relative to the input at three volume control settings (0, −12 and −24 dB). The plots illustrate the effects of varying the values of the program dynamic range (PDR), effects level (EL), noise threshold (NT) and compression threshold (Thresh). The output is calculated as:

$$\text{Output}=\text{Thresh}+(\text{Input}-\text{Thresh})/\text{Ratio}+\text{MakeupGain}+V, \text{ if Input}>\text{Thresh}; \text{ and} \quad [\text{Eq. 4}]$$

$$\text{Output}=\text{Input}+\text{MakeupGain}+V, \text{ if Input}<=\text{Thresh}, \quad [\text{Eq. 5}]$$

where the Ratio is calculated in accordance with Equations 2 and 3 and the MakeupGain is calculated in accordance with Equation 1.

Figure 4:
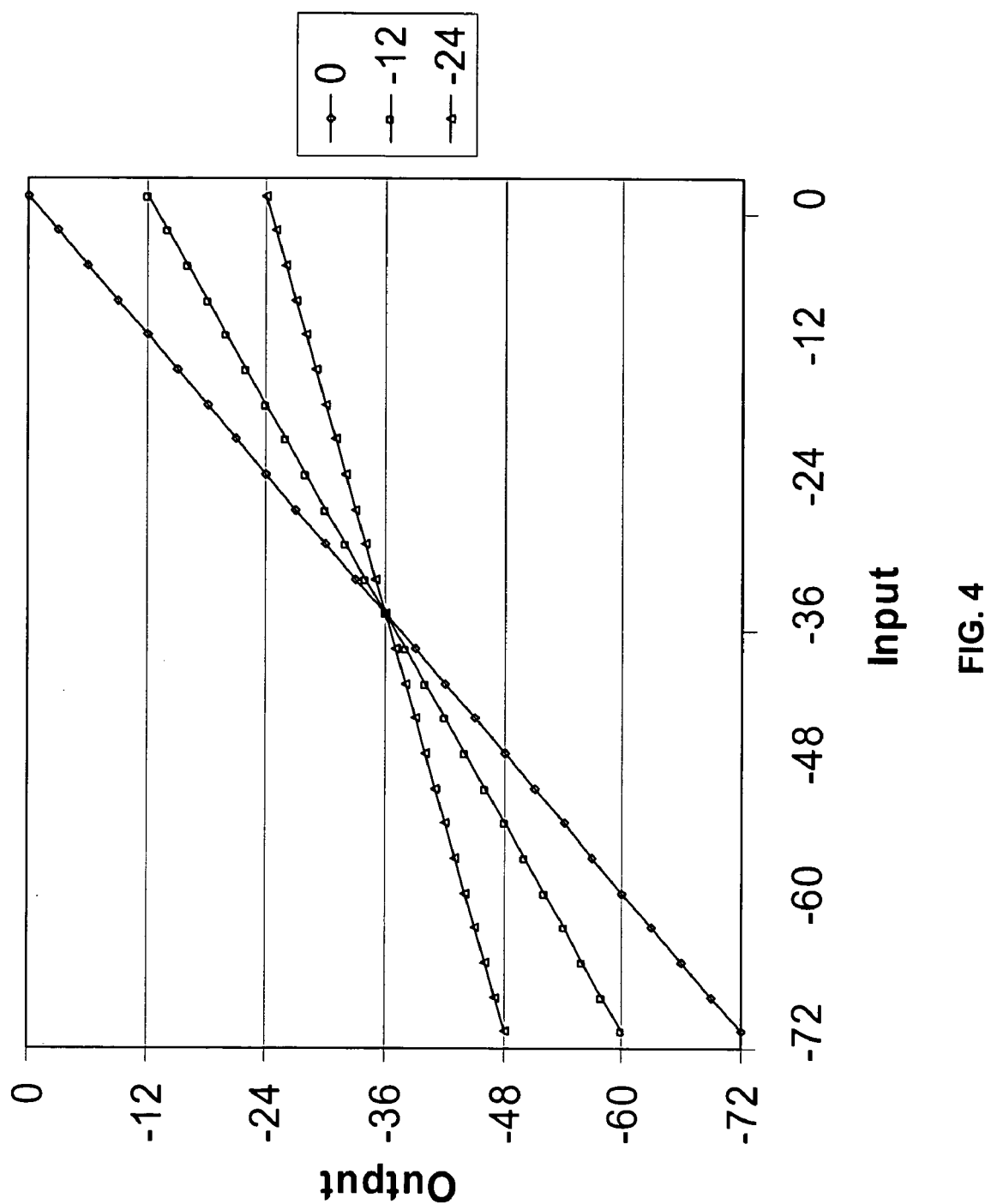
FIGS. 4-7 are plots of the output of the compressor in which various input parameters are adjusted.
Figure 5:
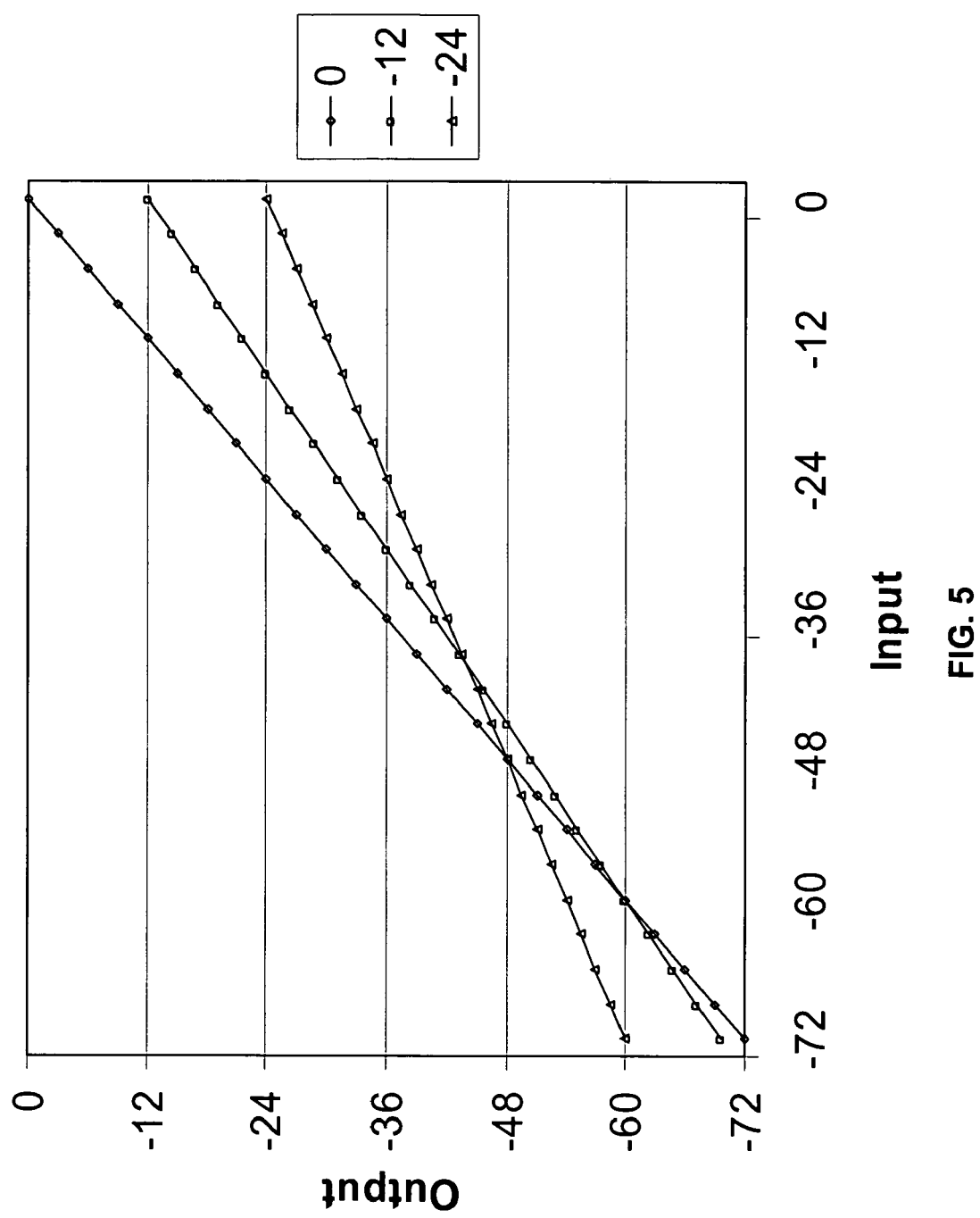

FIGS. 4 and 5 illustrate the effect of changing the effects level from 100 ("normal" or full compression) in FIG. 4 to 50 (50% of normal) in FIG. 5. The three plots in each Fig. represent three volume levels: 0, −12 and −24 dB. In both Figs., PDR is set to 36 dB, NT is set to −36 dB and Thresh is set to −72 dB. In FIG. 4, the compression ratio is computed to be 1, 1.5 and 3 and the MakeupGain computed to be 0, 24 and 48, respectively. In FIG. 5, the compression ratio is computed to be 1, 1.25 and 2 and the MakeupGain computed to be 0, 14.4 and 36 dB, respectively.

Figure 6:
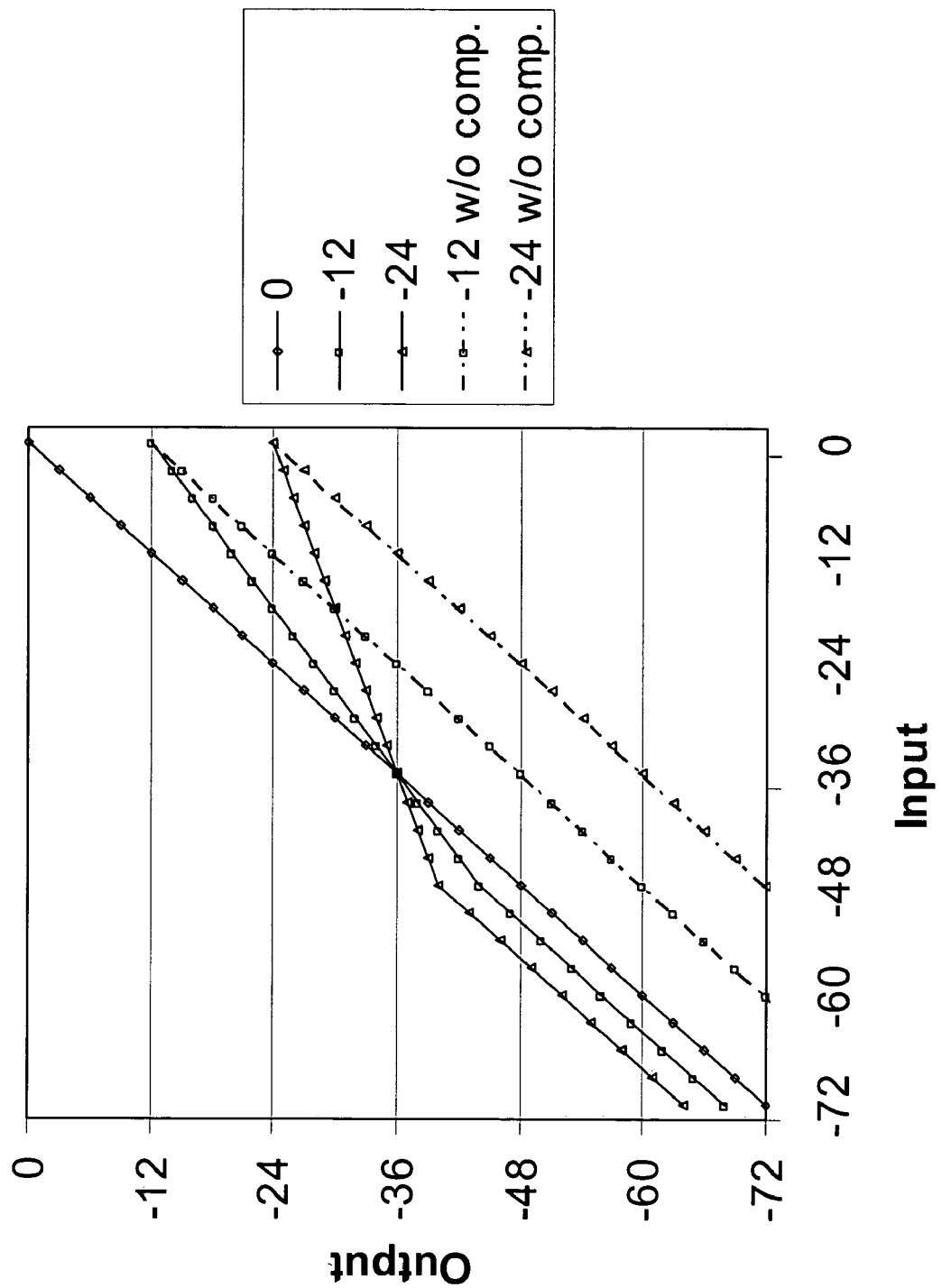
Figure 7:
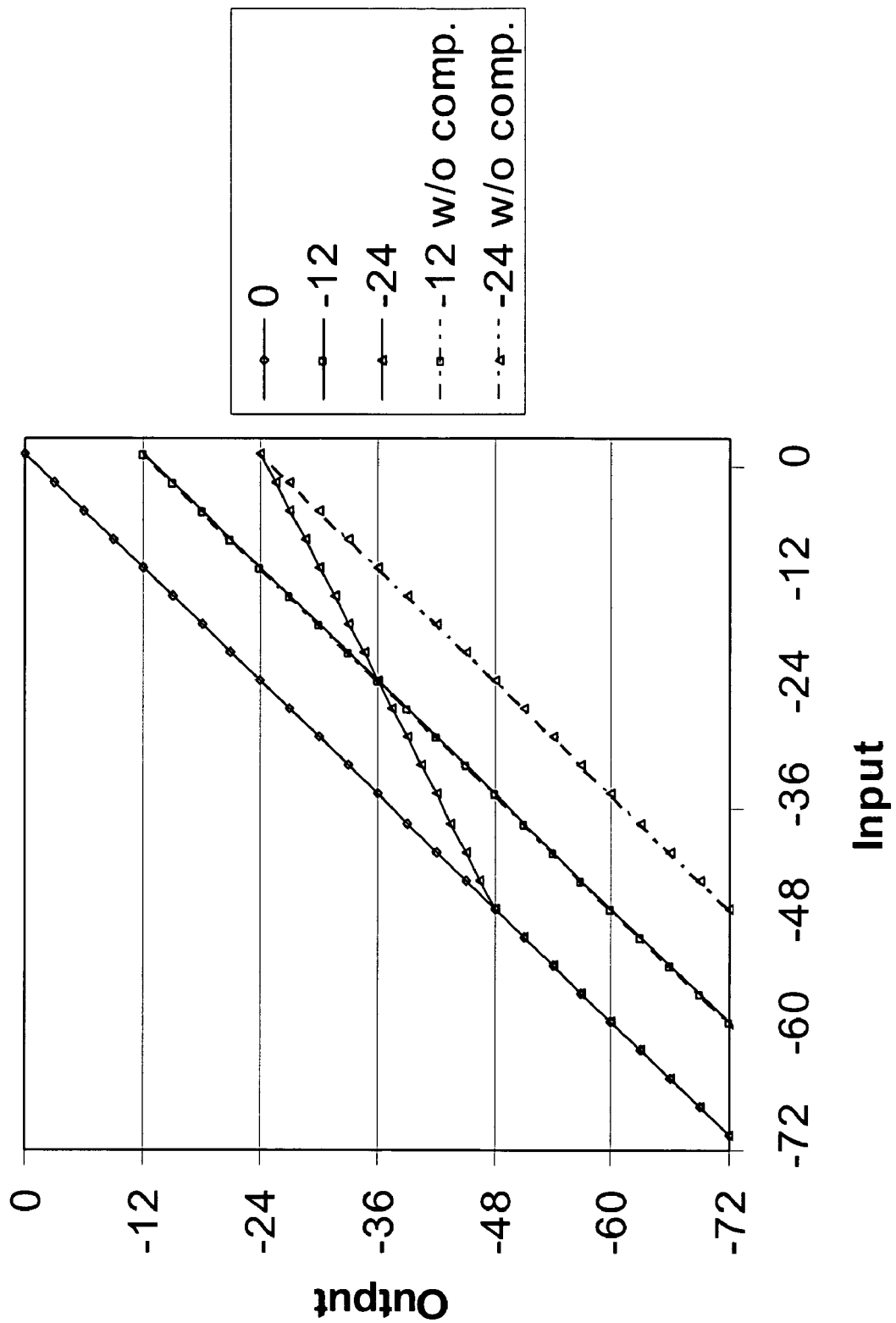

FIGS. 6 and 7 illustrate the effect of changing the program dynamic range from 36 (wide) in FIG. 6 to 24 (narrow) in FIG. 7. Again, the three plots in each Fig. represent three volume levels: 0, −12 and −24 dB. In both Figs., EL is set to 100, NT is set to −36 dB and Thresh is set to −48 dB. In FIG. 6, the compression ratio is computed to be 1, 1.5 and 3 and the MakeupGain computed to be 0, 16 and 32 dB, respectively. In FIG. 7, the compression ratio is computed to be 1, 1 and 2 and the MakeupGain computed to be 0, 0 and 24 dB, respectively. In addition, for ease of comparison, FIGS. 6 and 7 include plots (dotted lines) of the output vs. input at the three volume levels but without any compression or makeup gain applied.

The objects of the invention have been fully realized through the embodiments disclosed herein. Those skilled in the art will appreciate that the various aspects of the invention may be achieved through different embodiments without departing from the essential function of the invention. For example, in multi-channel applications (eg., stereo and surround sound), a multi-channel compressor may be employed. A single set of controls is used to set the parameters of each parallel compressor chain so the all affect their respective audio signals in the same way. The particular embodiments are illustrative and not meant to limit the scope of the invention as set forth in the following claims.

What is claimed is:

1. An audio compressor, comprising:
an audio input coupled to receive audio source material;
an audio level input coupled to receive an audio level signal indicative of a desired audio output level V;

a processor operable to generate a compression ratio having a level inversely proportional to the level of the audio level signal and generated as:

$1+(PDR/(V-NT)-1)*EL$, if $(NT+PDR)>V$; and 1 if $(NT+PDR) \leq V$;

where NT is an ambient noise threshold, PDR is a program dynamic range level and EL is an effects level having a range from 0% to at least 100%;

a compression stage operable to apply compression to the audio source material in response to the level of the compression ratio; and an audio output operable to provide a compressed audio signal to an audio gain stage having an output level controlled by the audio level signal.

2. The audio compressor of claim 1, further comprising a noise threshold input coupled to receive a signal indicative of an ambient noise level NT, the processor further operable to adjust the compression ratio in response to the ambient noise level.

3. The audio compressor of claim 1, further comprising a noise threshold input coupled to receive a signal from a vehicle status detector indicative of an ambient noise level in the vehicle, the processor further operable to adjust the compression ratio in response to the ambient noise level.

4. The audio compressor of claim 3, the vehicle status detector comprising at least one of a velocity sensor, a window state sensor, a sun roof state sensor and a top state sensor.

5. The audio compressor of claim 1, further comprising an effects level input coupled to receive an effects level signal EL from a user-adjustable control, the processor further operable to adjust the compression ratio in response to the effects level signal.

6. The audio compressor of claim 5, wherein the effects level signal has a range from 0% to at least 100%, wherein:

an effects level of 0% results in no compression being applied to the audio source material;

an effects level of 100% results in a predetermined normal amount of compression being applied to the audio source material; and an effects level greater than 100% results in an excessive amount of compression being applied to the audio source material.

7. The audio compressor of claim 1, further comprising a program dynamic range input coupled to receive a program dynamic range PDR indicative of a dynamic range of the audio source material, the processor further operable to adjust the compression ratio in response to the program dynamic range.

8. The audio compressor of claim 7, wherein the received program dynamic range is one of a plurality of user-selectable program dynamic ranges.

9. The audio compressor of claim 7, wherein the received program dynamic range is transmitted from a program dynamic range detector operable to determine the program dynamic range of the audio source material.

10. The audio compressor of claim 1, wherein the audio output is operable to provide a compressed audio signal to a makeup gain stage interposed between the compressor and the audio gain stage, a gain of the makeup gain stage being increased in direct proportion to the amount of compression applied to the audio source material.

11. An audio amplifier, comprising:

an audio input coupled to receive audio source material having a signal level Input;

a user-adjustable volume control operable to generate an audio level signal V indicative of a desired audio output level;

an audio level input coupled to receive the audio level signal;

an adjustable compression control, coupled to the volume control and operable to generate a compression ratio signal in inverse proportion to the audio level signal, the compression ratio being:

$1+(PDR/(V-NT)-1)*EL$, if $(NT+PDR)>V$; and 1 if $(NT+PDR) \leq V$ where NT is an ambient noise threshold, PDR is a program dynamic range level and EL is an effects level having a range from 0% to at least 100%;

means for applying compression to the audio source material in response to the level of the compression ratio signal and outputting a compressed audio signal; and an audio gain stage, coupled to the compression means and the volume control, operable to adjust a gain of the compressed audio signal in response to the audio level signal.

12. The audio amplifier of claim 11, further comprising:

means for generating a noise threshold signal NT indicative of the ambient noise level; and means for adjusting the compression ratio in response to the noise threshold signal.

13. The audio amplifier of claim 11, further comprising:

a user-adjustable effects level control having an output with a range from 0% to at least 100%; and means for adjusting the compression ratio in response to the output of the effects level control, wherein:

an effects level of 0% results in no compression being applied to the audio source material;

an effects level of 100% results in a predetermined amount of compression being applied to the audio source material; and an effects level greater than 100% results in an excessive amount of compression being applied to the audio source material.

14. The amplifier of claim 11, further comprising a makeup gain stage interposed between the compressor and the audio gain stage and having an output level which is increased in direct proportion to the amount of compression applied to the audio source material.

15. The amplifier of claim 11, further comprising:

a program dynamic range control operable to determine a program dynamic range PDR of the audio source material; and means for adjusting the compression ratio in response to the program dynamic range.

16. The audio compressor of claim 15, the program dynamic range control comprising user-operable means for selecting one of a plurality of program dynamic ranges.

17. The audio compressor of claim 15, the program dynamic range control comprising means for determining the program dynamic range from the audio source material.

18. The amplifier of claim 11, further comprising:

an ambient level detector, comprising means for generating a noise threshold signal NT indicative of the ambient noise level;

means for adjusting the compression ratio in response to the noise threshold signal;

a user-adjustable effects level control having an output EL with a range from 0% to at least 100%;

means for adjusting the compression ratio in response to the output of the effects level control, wherein:
an effects level of 0% results in no compression being applied to the audio source material;
an effects level of 100% results in a predetermined full amount of compression being applied to the audio source material; and
an effects level greater than 100% results in an excessive amount of compression being applied to the audio source material;
a program dynamic range control operable to determine a program dynamic range PDR of the audio source material;
means for adjusting the compression ratio in response to the program dynamic range; and
a makeup gain stage interposed between the compressor and the audio gain stage and having an output level which is increased in direct proportion to the amount of compression applied to the audio source material.

19. The amplifier of claim 18, wherein:
an output level of the audio gain stage is:

Thresh+(Input−Thresh)/Ratio+MakeupGain+$V$, if Input>Thresh; and

Input+MakeupGain+$V$, if Input<=Thresh;

where Thresh is a threshold level below which no compression is applied.

20. The amplifier of claim 11, wherein the volume control and the compression control each comprise one portion of a dual-potentiometer.

21. A method of applying compression to audio source material, comprising:
adjusting a volume control level V to affect the gain of an output of an audio amplifier;
dynamically adjusting a compression ratio in response to the volume control level and in inverse proportion thereto, the compression ratio being:

1+($PDR/(V-NT)$−1)*$EL$, ($NT+PDR$)>$V$; and 1 if ($NT+PDR$)≦$V$;

where NT is an ambient noise threshold, PDR is a program dynamic range level and EL is an effects level having a range from 0% to at least 100%;
receiving audio source material in the audio amplifier; and
applying compression to the audio source material in an amount determined by the compression ratio.

22. The method of claim 21, further comprising adjusting the compression ratio in response to an ambient noise level.

23. The method of claim 22, wherein the ambient noise level is measured inside a vehicle.

24. The method of claim 23, wherein the ambient noise level is detected by at least one sensor measuring a noise generating characteristic of the vehicle.

25. The method of claim 23, wherein the ambient noise level is measured by at least one of a velocity sensor, a window state sensor, a sun roof state sensor and a top state sensor.

26. The method of claim 21, further comprising, adjusting the compression ratio in response to a received effects level signal.

27. The method of claim 26, wherein the effects level signal has a range from 0% to at least 100%, and wherein:
an effects level of 0% results in no compression being applied to the audio source material;
an effects level of 100% results in a predetermined normal amount of compression being applied to the audio source material; and
an effects level greater than 100% results in an excessive amount of compression being applied to the audio source material.

28. The method of claim 21, further comprising adjusting the compression ratio in response to a program dynamic range of the audio source material.

29. The method of claim 28, further comprising selecting the program dynamic range from a plurality of user-selectable program dynamic ranges.

30. The method of claim 28, further comprising dynamically determining the program dynamic range of the audio source material from the audio source material.

31. The method of claim 21, further comprising applying a makeup gain to the compressed audio source material directly proportion to the compression ratio.

32. The method of claim 21, further comprising:
adjusting the compression ratio in response to an ambient noise level NT;
adjusting the compression ratio in response to a received effects level signal EL;
adjusting the compression ratio in response to a program dynamic range PDR of the audio source material; and
applying a makeup gain to the compressed audio source material directly proportion to the compression ratio.

33. The method of claim 32, wherein:
an output level of the compressed audio is:

Thresh+(Input−Thresh)/Ratio+MakeupGain+$V$, if Input>Thresh; and

Input+MakeupGain+$V$, if Input<=Thresh;

where Thresh is a threshold level below which no compression is applied.

34. An audio compressor, comprising:
an audio input coupled to receive audio source material;
an audio level input coupled to receive an audio level signal indicative of a desired audio output level V;
a processor operable to generate a compression ratio having a level inversely proportional to the level of the audio level signal and generated as:

1+($PDR/(V-NT)$−1)*$EL$, if ($NT+PDR$)>$V$; and 1 if ($NT+PDR$)≦$V$;

where NT is an ambient noise threshold, PDR is a program dynamic range level and EL is an effects level having a range from 0% to at least 100%;
a compression stage operable to apply compression to the audio source material in response to the level of the compression ratio;
a makeup gain stage coupled to receive a compressed audio signal from the compression stage and having a gain which is increased in direct proportion to the amount of compression applied to the audio source material; and
an audio output coupled to receive a compressed, gain-adjusted audio signal from the makeup gain stage and operable to provide a processed audio signal to an audio gain stage having an output level controlled by the audio level signal.

35. The audio compressor of claim 34, further comprising a noise threshold input coupled to receive a signal indicative of an ambient noise level NT, the processor further operable to adjust the compression ratio in response to the ambient noise level.

36. The audio compressor of claim 34, further comprising a noise threshold input coupled to receive a signal from a vehicle status detector indicative of an ambient noise level in the vehicle, the processor further operable to adjust the compression ratio in response to the ambient noise level.

37. The audio compressor of claim 36, the vehicle status detector comprising at least one of a velocity sensor, a window state sensor, a sun roof state sensor and a top state sensor.

38. The audio compressor of claim 34, further comprising an effects level input coupled to receive an effects level signal EL from a user-adjustable control, the processor further operable to adjust the compression ratio in response to the effects level signal.

39. The audio compressor of claim 38, wherein the effects level signal has a range from 0% to at least 100%, wherein:
 an effects level of 0% results in no compression being applied to the audio source material;
 an effects level of 100% results in a predetermined normal amount of compression being applied to the audio source material; and
 an effects level greater than 100% results in an excessive amount of compression being applied to the audio source material.

40. The audio compressor of claim 34, further comprising a program dynamic range input coupled to receive a program dynamic range PDR indicative of a dynamic range of the audio source material, the processor further operable to adjust the compression ratio in response to the program dynamic range.

41. The audio compressor of claim 40, wherein the received program dynamic range is one of a plurality of user-selectable program dynamic ranges.

42. The audio compressor of claim 40, wherein the received program dynamic range is transmitted from a program dynamic range detector operable to determine the program dynamic range of the audio source material.

43. The audio compressor of claim 34, comprising a downward compressor.

\* \* \* \* \*